United States Patent
Cao et al.

(10) Patent No.: US 8,403,279 B2
(45) Date of Patent: Mar. 26, 2013

(54) FASTENING DEVICE AND HEAT DISSIPATION APPARATUS USING THE SAME

(75) Inventors: Lei Cao, Shenzhen (CN); Min Li, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 446 days.

(21) Appl. No.: 12/756,981

(22) Filed: Apr. 8, 2010

(65) Prior Publication Data

US 2011/0108234 A1    May 12, 2011

(30) Foreign Application Priority Data

Nov. 12, 2009  (CN) .......................... 2009 1 0309635

(51) Int. Cl.
*A47B 96/00*  (2006.01)

(52) U.S. Cl. .............. 248/225.11; 248/223.21; 361/700; 361/711

(58) Field of Classification Search ............. 248/225.11, 248/225.21, 223.21; 361/700, 709–711, 361/679.52, 679.54, 719
See application file for complete search history.

(56) References Cited

U.S. PATENT DOCUMENTS

| | | | |
|---|---|---|---|
| 5,542,468 A * | 8/1996 | Lin | 165/80.3 |
| 5,791,403 A * | 8/1998 | Chiou | 165/80.3 |
| 6,250,375 B1 * | 6/2001 | Lee et al. | 165/80.3 |
| 6,430,049 B1 * | 8/2002 | Lai et al. | 361/704 |
| 6,466,445 B1 * | 10/2002 | Chen | 361/704 |
| 6,492,202 B1 * | 12/2002 | Lober et al. | 438/122 |
| 6,501,656 B1 * | 12/2002 | Peng et al. | 361/703 |
| 6,507,489 B1 * | 1/2003 | McGowan et al. | 361/679.54 |
| 6,522,545 B2 * | 2/2003 | Shia et al. | 361/704 |
| 6,771,506 B2 * | 8/2004 | Lee et al. | 361/704 |
| 7,017,653 B2 * | 3/2006 | Lotter et al. | 165/80.3 |
| 7,042,728 B2 * | 5/2006 | Hu | 361/704 |
| 7,063,136 B2 * | 6/2006 | Yu et al. | 165/185 |
| 7,239,518 B2 * | 7/2007 | Yang et al. | 361/704 |
| 7,301,774 B2 * | 11/2007 | Lee et al. | 361/719 |
| 7,333,333 B2 * | 2/2008 | Zhao et al. | 361/700 |
| 7,631,402 B2 * | 12/2009 | Huang | 24/457 |
| 7,719,840 B2 * | 5/2010 | Lin et al. | 361/710 |
| 7,835,152 B2 * | 11/2010 | Wang et al. | 361/710 |
| 2003/0159819 A1 * | 8/2003 | Lee | 165/185 |
| 2004/0257770 A1 * | 12/2004 | Hu | 361/704 |
| 2005/0066487 A1 * | 3/2005 | Zhang | 24/457 |
| 2005/0195572 A1 * | 9/2005 | Franz et al. | 361/707 |

* cited by examiner

*Primary Examiner* — Terrell McKinnon
*Assistant Examiner* — Monica Millner
(74) *Attorney, Agent, or Firm* — Altis Law Group, Inc.

(57) ABSTRACT

A fastening device includes a fixing bracket and a fastener. The fixing bracket includes a fixed arm and two adjusting arms respectively connecting at two ends of the fixed arm. Each of the two ends of the fixed arm defines a plurality of spaced retaining slots. The retaining slots are located at different positions along the fixed arm. Each of the two adjusting arms has a sliding end retained selectively in one of the retaining slots and an opposite fixing end. The fastener extends through the fixing end of each of the two adjusting arms.

13 Claims, 4 Drawing Sheets

FASTENING DEVICE AND HEAT DISSIPATION APPARATUS USING THE SAME

BACKGROUND

1. Technical Field

The disclosure relates to fastening devices, and more particularly to a fastening device for fastening a heat sink on an electronic device mounted on a printed circuit board.

2. Description of Related Art

With continuing developments in computer technology, many modern electronic devices such as central processing units (CPUs) operate at high speed. It is well known that when such electronic devices operate at high speed, they generate more heat than at low speed. If the heat is not dissipated efficiently, the stability of operation of the electronic device may be severely impacted. Generally, in order to ensure that the electronic device runs normally, a heat sink is used to dissipate the heat generated by the electronic device.

Conventionally, in order to keep the heat sink in intimate contact with the electronic device mounted on a printed circuit board (PCB), a securing mechanism is utilized to secure the heat sink to the PCB. The heat sink generally has a fixing bracket mounted on a bottom thereof. The fixing bracket defines a plurality of through holes at corners thereof. The PCB is provided with a plurality of retaining pillars, each having a threaded hole defined therein. The retaining pillars surround the electronic device. The plurality of through holes of the fixing bracket are in alignment with the threaded holes of the retaining pillars, respectively. In assembly, a plurality of screws are extended through the through holes of the fixing bracket and engaged in the threaded holes of the retaining pillars of the PCB, respectively, thereby securing the heat sink to the PCB. However, there are many different kinds of PCBs made according to different industry standards, and these PCBs have differing layouts of the threaded holes. A particular heat sink with its fixing bracket may fit a particular PCB. However, if the heat sink is to be used with another different PCB, the through holes of the fixing bracket may not match the threaded holes of the other PCB. That is, and the heat sink cannot be mounted on the other PCB using the fixing bracket.

What is needed, therefore, is a fastening device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
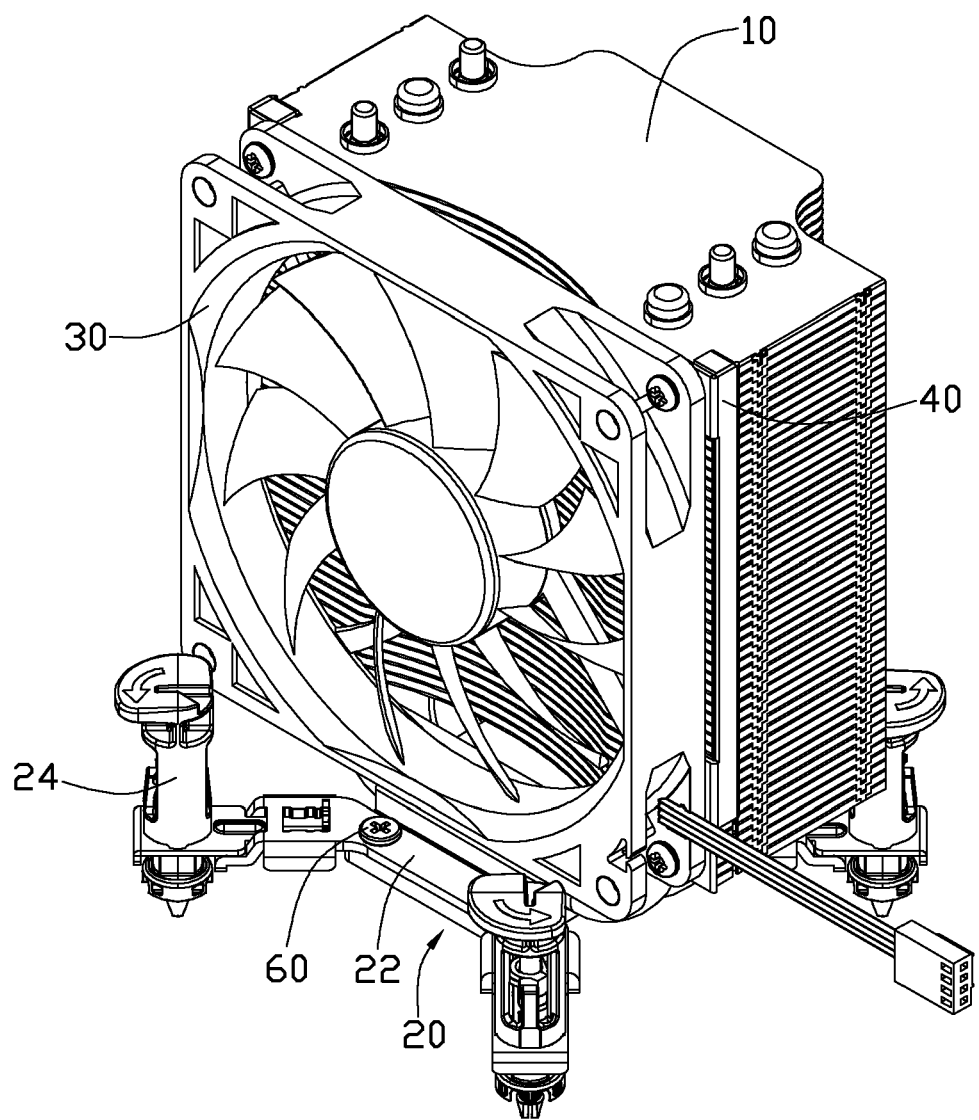
FIG. 1 is an isometric, assembled view of a heat dissipation apparatus in accordance with one embodiment of the disclosure.

Referring to FIG. 1, a heat dissipation apparatus in accordance with an embodiment of the disclosure is provided for cooling an electronic device (not shown) mounted on a printed circuit board (not shown). The heat dissipation apparatus includes a heat sink 10 thermally contacting the electronic device, a fastening device 20 mounted at a bottom of the heat sink 10, a fan 30 mounted at a side of the heat sink 10, and a holder 40 fixing the fan 30 on the heat sink 10.

The fastening device 20 includes two fixing brackets 22 and four fasteners 24 attached to the two fixing brackets 22. The fixing brackets 22 are mounted at two opposite sides of the bottom of the heat sink 10. The fasteners 24 extend through the fixing brackets 22 and are engaged in mounting holes (not shown) defined in the printed circuit board to thereby fasten the heat dissipation apparatus on the printed circuit board.

Figure 2:
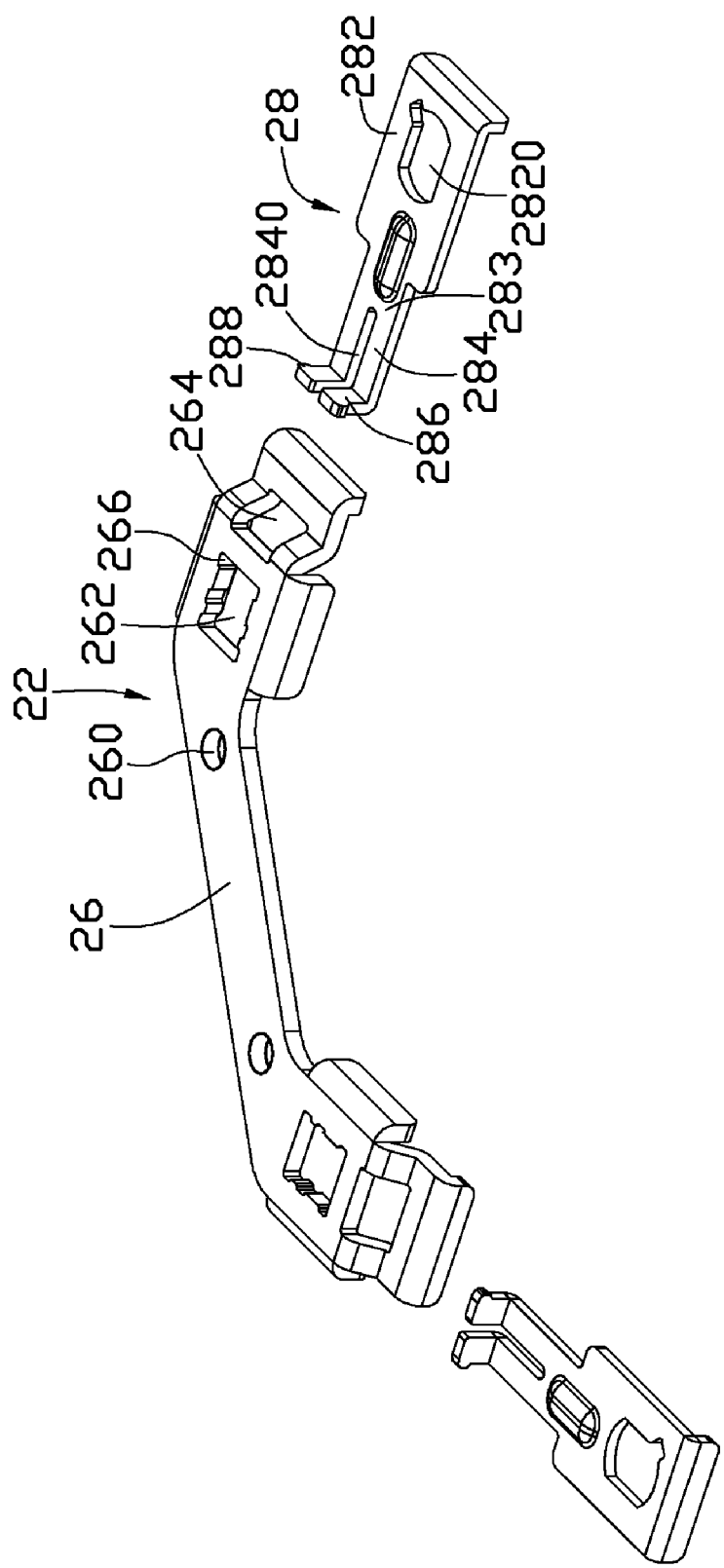
FIG. 2 is an isometric, exploded view of a fixing bracket of the heat dissipation apparatus of FIG. 1.

Referring also to FIG. 2, each fixing bracket 22 includes a fixed arm 26 fixed on the heat sink 10, and two adjusting arm 28 respectively connecting at two ends of the fixed arm 26.

Each adjusting arm 28 includes a fixing end 282 and a sliding end 283. The fixing end 282 has a width larger than that of the sliding end 283. The sliding end 283 defines a slit 2840 therein, which extends along a lengthwise direction of the sliding end 283, whereby the slit 2840 divides the sliding end 283 into two sliding legs 284. A locking leg 286 extends vertically and upwardly from a distal end of each sliding leg 284. An abutting tab 288 protrudes laterally outwardly from a distal end of each locking leg 286. The fixing end 282 of the adjusting arm 28 defines a fixing hole 2820 therein, and the fastener 24 extends through the fixing hole 2820 and is fixed on the fixing end 282.

Each fixed arm 26 is generally C-shaped, and defines two through holes 260 in a middle portion thereof. Two screws 60 are extended through the two through holes 260 to fix the fixed arm 26 on the heat sink 10. An elongated adjusting groove 262 and a generally rectangular limiting hole 264 are defined in each of the two opposite ends of the fixed arm 26. The adjusting groove 262 and the limiting hole 264 are spaced from each other. The limiting hole 264 is located near a free end of the fixed arm 26, and the adjusting groove 262 is located at an inner side (or back side) of the limiting hole 264. The limiting hole 264 has a width equal to that of the sliding end 283 of the corresponding adjusting arm 28, while the adjusting groove 262 has a width slightly smaller than that of the sliding end 283. A front portion of the free end of the fixed arm 26 where the limiting hole 264 is defined slopes downward relative to a back portion of the free end of the fixed arm 26 where the adjusting groove 262 is defined. Thus, the limiting hole 264 is located lower than the adjusting groove 262, such that the limiting hole 264 is aligned with the sliding end 283 of the adjusting arm 28. Three spaced retaining slots 266 are defined in each of two lateral sides of the adjusting groove 262, for selectively engagingly receiving the locking legs 286 of the adjusting arm 28. That is, there is a total of three pairs of retaining slots 266 formed in the adjusting groove 262.

Figure 3:
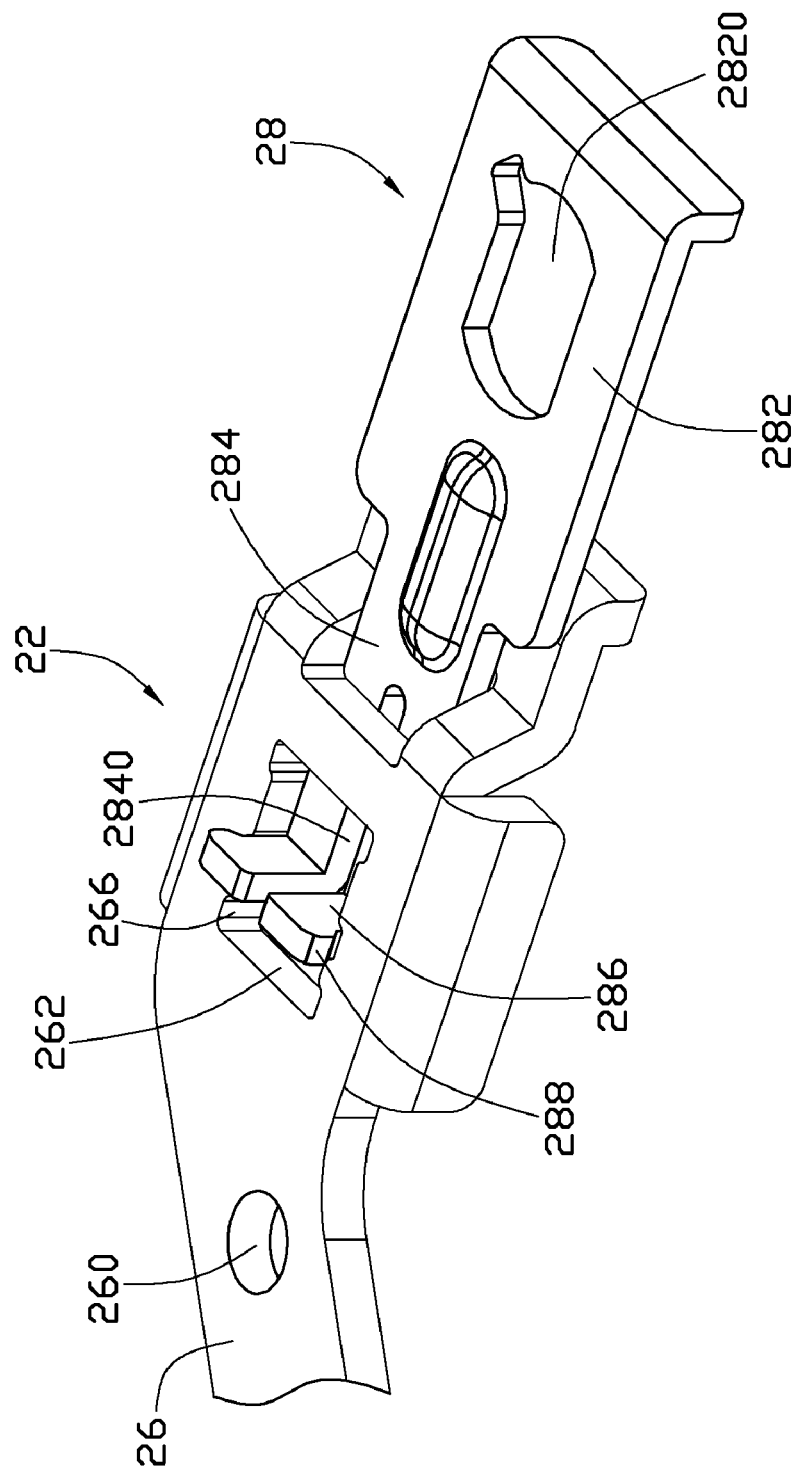
FIG. 3 is a view of part of the fixing bracket of FIG. 2, showing an adjusting arm thereof attached to a fixing arm thereof.
Figure 4:
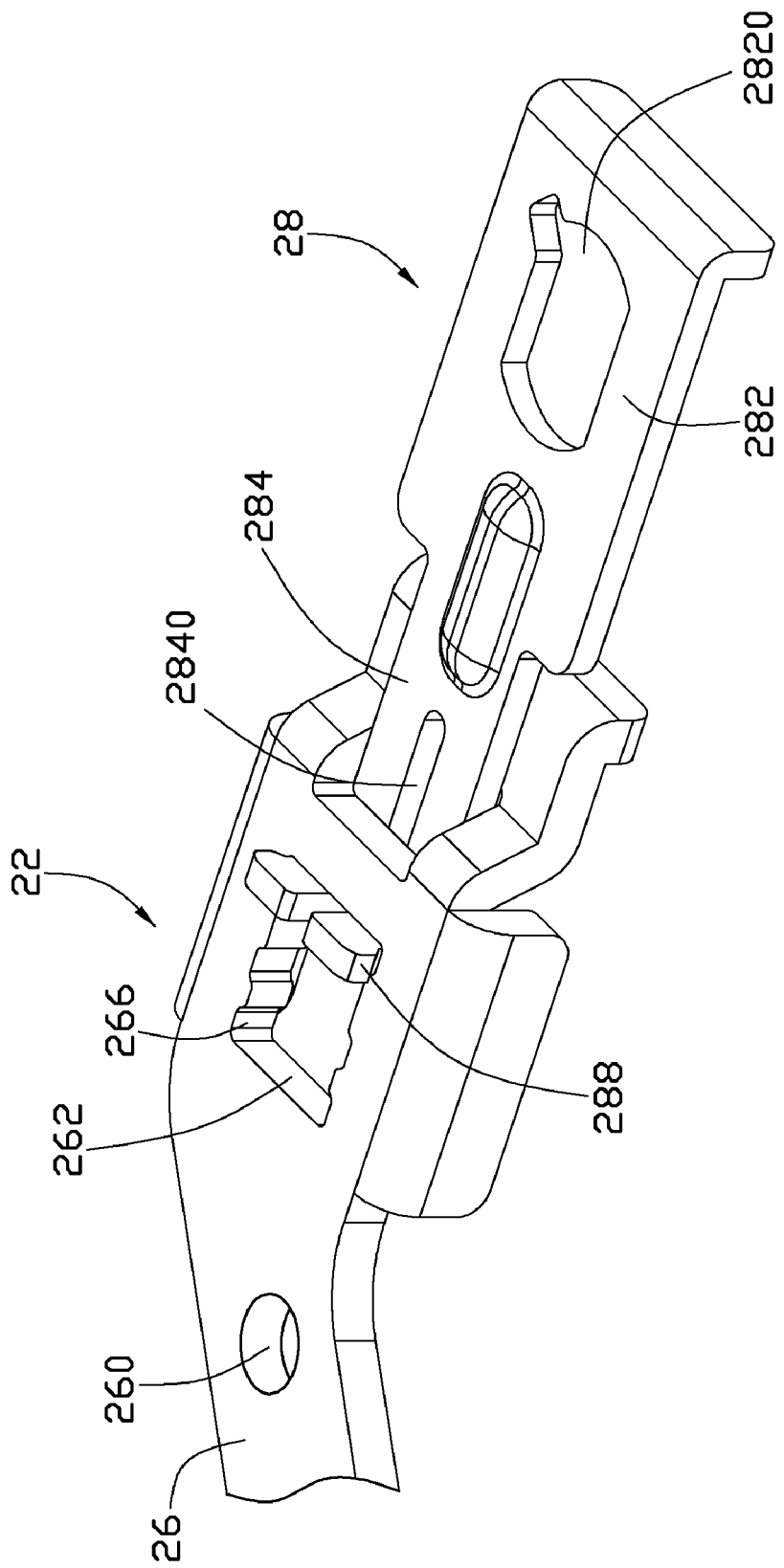
FIG. 4 is similar to FIG. 3, but showing the adjusting arm in a different position relative to the fixing arm.

Referring also to FIGS. 3-4, in assembly of the fixing bracket 22, the two adjusting arms 28 are secured to the two free ends of the fixed arm 26, respectively. In particular, the sliding end 283 of each adjusting arm 28 extends into the corresponding limiting hole 264 of the fixed arm 26 to cause the two sliding legs 284 and the two locking legs 286 to enter a bottom side of the adjusting groove 262 of the fixed arm 26. The locking legs 286 of the adjusting arm 28 are aligned with one pair of the three pairs of retaining slots 266 of the fixed arm 26. Then, the sliding end 284 is pushed upwardly to move towards the adjusting groove 262. During this process, the abutting tabs 288 of the adjusting arm 28 are pressed by inner walls of the retaining slot 266 and elastically contract toward each other in the slit 2840. After the abutting tabs 288 and the locking legs 286 have extended upwardly completely through the corresponding pair of retaining slots 266, the abutting tabs 288 rebound and abut a top surface of the fixed arm 26. Thereby, the locking legs 286 are retained in the corresponding pair of retaining slots 266. Thus the adjusting arm 28 is fixedly and firmly connected to the fixed arm 26.

When the fastening device 20 is used to mount the heat dissipation apparatus on the printed circuit board, each adjusting arm 28 of each fixing bracket 22 can be moved horizontally relative to the corresponding fixed arm 26. Thereby, the locking legs 286 retained in a certain pair of the retaining slots 266 of the fixed arm 26 can be moved to engage in a different pair of retaining slots 266. That is, the position of the adjusting arm 28 relative to the fixed arm 26 can be adjusted, so that the fasteners 24 can be aligned with the mounting holes of different kinds of printed circuit boards having different layouts. For example, in FIG. 3, the locking legs 286 of one of the adjusting arms 28 of one of the fixing brackets 22 are retained in the middle pair of retaining slots 266 of the corresponding fixed arm 26. In another example, in FIG. 4, the locking legs 286 of the adjusting arm 28 are retained in the front pair of retaining slots 266 of the fixed arm 26.

It is believed that the embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A fastening device comprising:
a fixing bracket comprising a fixed arm and two adjusting arms respectively connecting at two ends of the fixed arm, each of the two ends of the fixed arm defining a plurality of spaced retaining slots, the retaining slots being located at different positions along a length of the end of the fixed arm, each of the adjusting arms having a sliding end selectively retained in at least one of the retaining slots of a corresponding end of the fixed arm, and an opposite fixing end; and
two fasteners each extending through the fixing end of a corresponding one of the adjusting arms;
wherein the sliding end defines a lengthwise slit therein, the slit extends along a lengthwise direction of the sliding end and divides the sliding end into two sliding legs, and a locking leg extends upwardly and vertically from a distal end of each of the two sliding legs.

2. The fastening device of claim 1, wherein each of the two ends of the fixed arm defines an elongated adjusting groove with the retaining slots defined in each of two opposite lateral sides of the adjusting groove, the retaining slots comprise a plurality of pairs of retaining slots with the retaining slots of each pair of retaining slots located at the opposite lateral sides of the adjusting groove, respectively, and the locking legs extend into the adjusting groove and are selectively retained in one of the pairs of retaining slots.

3. The fastening device of claim 2, wherein each of the two ends of the fixed arm further defines a rectangular limiting hole, the limiting hole is located closer to the end extremity of the end of the fixed arm than the adjusting groove, and the sliding legs of the adjusting arm extend into and are limited in the limiting hole.

4. The fastening device of claim 3, wherein the limiting hole is located lower than the adjusting groove such that the limiting hole is aligned with the sliding end of the adjusting arm.

5. The fastening device of claim 2, wherein the fixing end of each of the adjusting arms defines a fixing hole, and a corresponding one of the fasteners extends through the fixing hole.

6. The fastening device of claim 2, wherein an abutting tab protrudes outwardly from a distal end of each of the locking legs of each of the adjusting arms, and the two abutting tabs extend above the corresponding adjusting groove and abut a top surface of the fixed arm.

7. The fastening device of claim 2, wherein the sliding legs of the sliding end of each adjusting arm are resiliently deformable toward each other in the slit, and the locking legs of the sliding end are snappingly retained in said one of the pairs of retaining slots.

8. A heat dissipation apparatus adapted for cooling an electronic device mounted on a printed circuit board, the heat dissipation apparatus comprising:
a heat sink; and
a fastening device for fastening the heat sink on the printed circuit board, the fastening device comprising:
a fixing bracket comprising a fixed arm attached to the heat sink and two adjusting arms connecting at two ends of the fixed arm, each of the two ends of the fixed arm defining a plurality of spaced retaining slots, the retaining slots being located at different positions along a length of the end of the fixed arm, each of the two adjusting arms having a sliding end selectively retained in at least one of the retaining slots of a corresponding end of the fixed arm, and an opposite fixing end; and
two fasteners each extending through the fixing end of a corresponding one of the adjusting arms;
wherein the sliding end defines a lengthwise slit therein, the slit extends along a lengthwise direction of the sliding end and divides the sliding end into two sliding legs, and a locking leg extends upwardly and vertically from a distal end of each of the two sliding legs.

9. The heat dissipation apparatus of claim 8, wherein each of the two ends of the fixed arm defines an elongated adjusting groove with the retaining slots defined in each of two lateral sides of the adjusting groove, the retaining slots of the two lateral sides of the adjusting groove are formed into a plurality of pairs, and the locking legs extend into the adjusting groove and are retained in a corresponding pair of retaining slots.

10. The heat dissipation apparatus of claim 9, wherein each of the two ends of the fixed arm further defines a rectangular limiting hole in front of the adjusting groove, and the locking legs and the sliding legs of the adjusting arm extend into and are limited in the limiting hole.

11. The heat dissipation apparatus of claim 10, wherein the limiting hole is located lower than the adjusting groove such that the limiting hole is aligned with the sliding end of the adjusting arm.

12. The heat dissipation apparatus of claim 9, wherein an abutting tab protrudes outwardly from a distal end of each of the locking legs of the adjusting arm, and the two abutting tabs extend above the adjusting groove and abut on a top surface of the fixed arm.

13. The heat dissipation apparatus of claim 9, wherein the fixing end of the adjusting arm defines a fixing hole for the fastener to extend through.

* * * * *